(12) United States Patent
Shieh et al.

(10) Patent No.: US 6,906,353 B1
(45) Date of Patent: Jun. 14, 2005

(54) HIGH SPEED IMPLANTED VCSEL

(75) Inventors: Chan-Long Shieh, Paradise Valley, AZ (US); Hsing-Chung Lee, Calabasas, CA (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 10/715,165

(22) Filed: Nov. 17, 2003

(51) Int. Cl.$^7$ .......................... H01L 33/00; H01S 3/08
(52) U.S. Cl. ..................... 257/98; 257/94; 257/95; 257/96; 372/46; 372/96; 438/32; 438/39; 438/45
(58) Field of Search ................... 257/94–96, 98; 438/32, 39, 45; 372/43–46, 96

(56) References Cited

U.S. PATENT DOCUMENTS

| | | |
|---|---|---|
| 5,034,958 A | 7/1991 | Kwon et al. |
| 5,245,622 A | 9/1993 | Jewell et al. |
| 6,169,756 B1 | 1/2001 | Chirovsky et al. |
| 6,493,368 B1 | 12/2002 | Chirovsky et al. |
| 6,650,683 B2 * | 11/2003 | Ueki et al. ............... 372/96 |
| 2003/0123514 A1 * | 7/2003 | Cox et al. ............... 372/96 |

* cited by examiner

Primary Examiner—Donghee Kang
(74) Attorney, Agent, or Firm—Allen, Dyer, Doppelt, Milbrath & Gilchrist, P.A.

(57) ABSTRACT

A vertical cavity surface emitting laser includes a first mirror region forming a first distributed Bragg reflector, a first cladding region, an active region, a second cladding region including a high electrical resistance implanted region positioned to define a current path, a second mirror region, and a current spreading region. A first electrical contact is positioned on the current spreading region and a second electrical contact is positioned to conduct electrical current in circuit with the first electrical contact through the current path. The current spreading region and the second mirror region cooperate to produce substantially uniform current distribution in the current path. A third mirror region is positioned on the current spreading region. The second and third mirror regions cooperate to provide a complete distributed Bragg reflector.

5 Claims, 6 Drawing Sheets

HIGH SPEED IMPLANTED VCSEL

FIELD OF THE INVENTION

This invention relates to vertical cavity surface emitting lasers and, more particularly, to semiconductor lasers which operate reliably at high frequencies.

BACKGROUND OF THE INVENTION

Vertical cavity surface emitting lasers (hereinafter referred to as "VCSELs") have become the dominant light source for optical transmitters used in short-reach local area networks and storage area network applications, in which a multi-mode optical fiber is used for data transmission. VCSELs are low cost micro-cavity devices with high speed, low drive current and low power dissipation, with desirable beam properties that significantly simplify their optical packaging and testing. In order to extend the application of VCSELs to higher speed applications, the VCSEL must be capable of operating reliably at about 10 GHz.

Prior art VCSELs which include an oxide confinement may operate at 10 GHz, but they suffer from poor reliability. Prior art implanted VCSEL's typically operate at about 2 GHz, but are much more reliable than VCSEL's with oxide confinement.

The speed of an ion implanted VCSEL is limited by several factors. One factor is the lack of a good index guide. Another factor is from a size limitation due to a deep implant where the typical implant depth may be more than three microns. Further, the implant has a distribution with a large straggle and a large standard deviation. With a large implant distribution and the poor current confinement of a heavily doped mirror, the size is typically more than 20 microns wherein the speed is limited to less than 2 GHz. Hence, it is desirable to provide an ion implanted VCSEL with a dielectric mirror which may operate reliably at 10 GHz.

It would be highly advantageous, therefore, to remedy the foregoing and other deficiencies inherent in the prior art.

Accordingly, it is an object of the present invention to provide new and improved implanted VCSELs that operate reliably at high frequencies.

It is another object of the present invention to provide new and improved ion implanted VCSELs with substantially improved current spreading and, therefore, better efficiency.

It is another object of the present invention to provide a new and improved method of fabricating ion implanted VCSELs with substantially improved current spreading.

SUMMARY OF THE INVENTION

Briefly, to achieve the desired objects of the instant invention in accordance with a preferred embodiment thereof, provided is a high frequency vertical cavity surface emitting laser. The laser includes a first mirror region forming a first distributed Bragg reflector, a first cladding region, an active region, a second cladding region including a high electrical resistance implanted region positioned to define a current path, a second mirror region, and a current spreading region. A first electrical contact is positioned on the current spreading region and a second electrical contact is positioned to conduct electrical current in circuit with the first electrical contact through the current path. The current spreading region and the second mirror region cooperate to produce substantially uniform current distribution in the current path. A third mirror region is positioned on the current spreading region. The second and third mirror regions cooperate to provide a complete distributed Bragg reflector.

The desired objects of the instant invention are further achieved through a novel method of fabricating a high frequency vertical cavity surface emitting laser. The method includes providing a substrate and growing a first mirror region on the substrate, forming a complete distributed Bragg reflector. A first cladding region is grown on the first mirror region and an active region is grown on the first cladding region. A second cladding region, a second mirror region, and a current spreading region are sequentially grown on the active region. Ions are implanted through the current spreading region and the first mirror region into a portion of the second cladding region to define a current path. A third mirror region is formed on the current spreading region. The third mirror region and the second mirror region cooperate to provide a complete distributed Bragg reflector. A first electrical contact is positioned in electrical communication with the current spreading region and a second electrical contact is positioned to conduct electrical current in circuit with the first electrical contact through the current path. The current spreading region and the second mirror region cooperate to produce substantially uniform current distribution in the current path.

These and other features, aspects, and advantages of the present invention will become better understood with reference to the following drawings, description, and claims.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE DRAWINGS

Figure 1:
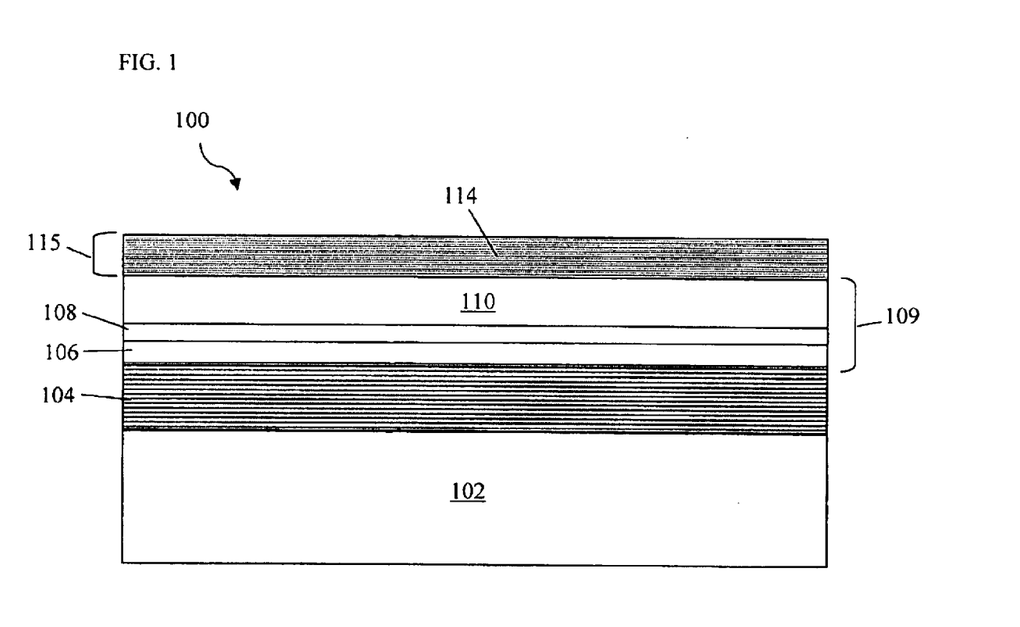
FIG. 1 is a simplified sectional view of an intermediate structure in a method of fabrication of a high speed implanted vertical cavity surface emitting laser in accordance with the present invention.

Turning now to FIG. 1, a simplified sectional view of an intermediate structure in a method of fabricating an ion implanted vertical cavity surface emitting laser 100 is illustrated. It will be understood that a single VCSEL is illustrated although generally a plurality of VCSELs are deposited or formed in blanket layers over an entire wafer so that a large number of VCSELs are fabricated simultaneously.

In this embodiment, VCSEL 100 includes a substrate 102. A mirror stack or region 104 is positioned on substrate 102 and a cladding region 106 is positioned on mirror region 104. An active region 108 is positioned on cladding region 106 and a cladding region 110 is positioned on active region 108. A mirror stack or region 114 is positioned on cladding region 110. Mirror region 114 is only a partial mirror or DBR, as will be described in more detail presently, and includes, generally, from one to five pairs of layers, whereas mirror region 104 is a complete mirror or DBR with approximately 40 pairs of layers. As is understood by those skilled in the art, the various layers described above are generally grown epitaxially in a well known continuous procedure.

Figure 2:
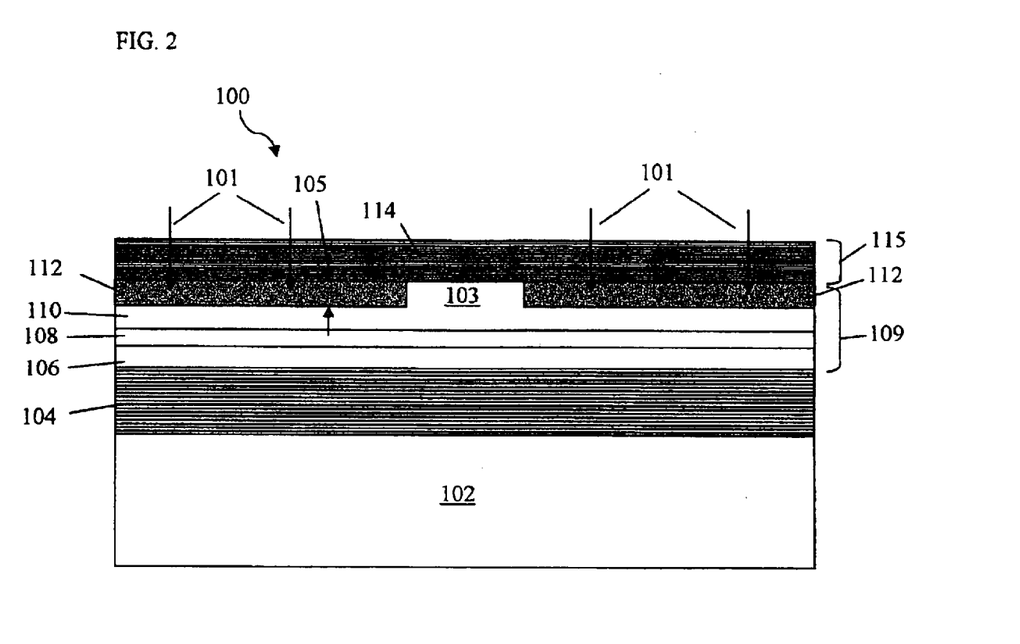
FIG. 2 is a simplified sectional view of a further intermediate structure in the fabrication of the high speed implanted vertical cavity surface emitting laser as illustrated in FIG. 1.

Turning now to FIG. 2, further intermediate structure in the method of fabricating VCSEL 100 is illustrated. As illustrated in FIG. 2, a dopant 101 is ion implanted through mirror region 114 a depth 115, to form an implant region 112 and a current path 103 defined within cladding region 110. It is preferred that implant region 112 be confined within cladding region 110 for improved operation of active region 108, however, in some embodiments implant region 112 may extend through or into active region 108 and cladding region 106.

Implant region 112 has a higher resistivity than adjacent material regions in cladding region 110. Implant region 112 is formed to substantially confine an electrical current to current path 103 to improve a single mode lasing operation. Hence, ion implantation is used to bombard some of the surrounding cladding region 110 in order to create a region of higher resistivity, and, thereby channel a substantial amount of the electrical current into the relatively more conductive current path 103.

In this embodiment, it is desirable to decrease depth 115 to increase the operational frequency of VCSEL 100. By implanting through mirror region 114, the implant depth to region 112 is shallower than the prior art where the ion implantation is generally through a dielectric distributed Bragg reflector or a complete epitaxially grown mirror stack (i.e. at least 40 pairs of layers). Because of these improvements (and others to be described) in fabrication and construction, VCSEL 100 may operate at 10 GHz compared to 2 GHz for prior art devices.

It will be understood that dopant 101 may include singly-charged protons ($H^+$), doubly-charged helium ions ($He^{++}$), or a similar dopant capable of forming implant region 112 with a high resistivity. It is believed that the higher resistivity of implant region 112 substantially results from deep levels created by the implant damage, whose energy states favor the compensation of implant region 112.

Figure 3:
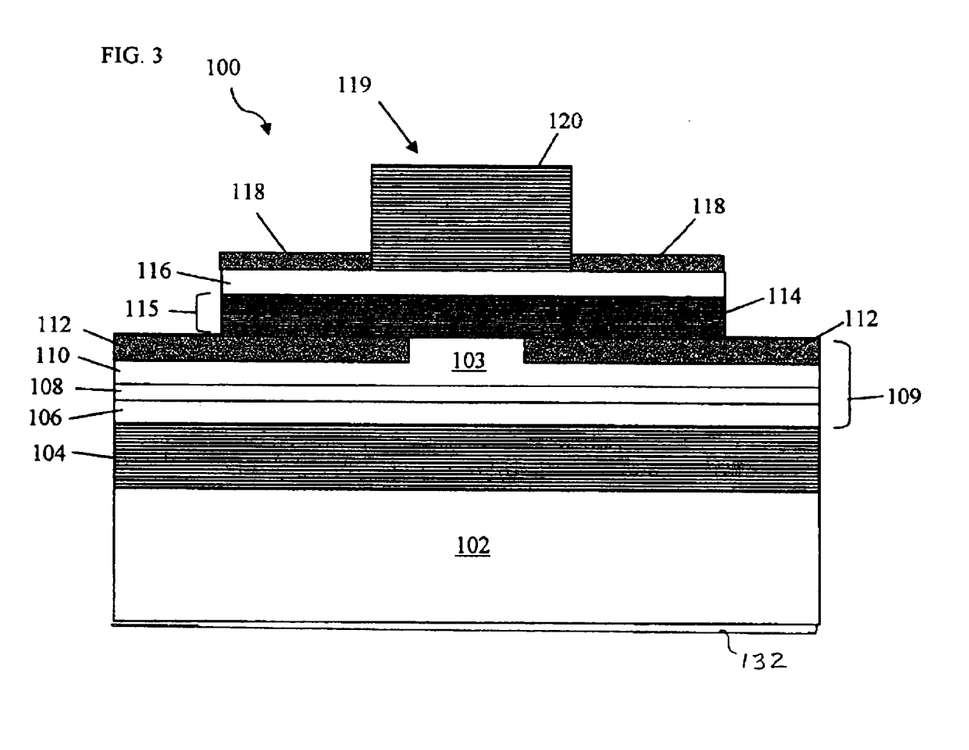
FIG. 3 is a simplified sectional view of further structure in the fabrication of the high speed implanted vertical cavity surface emitting laser as illustrated in FIG. 2.

Turning now to FIG. 3, a simplified sectional view is illustrated of further structure in the fabrication of VCSEL 100. In FIG. 3, a current spreading region 116 is positioned on mirror region 114. In this embodiment current spreading region 116 is a heavily doped semiconductor layer usually epitaxially grown on mirror region 115. Because current spreading region 116 is heavily doped it is a relatively good electrical conductor. A mirror stack or region 120 is positioned on current spreading region 116 and, in this embodiment, is etched to form a mesa 119. An intra-cavity electrical contact 118 is formed on current spreading region 116, for convenience, using mesa 119 as a mask. Another intra-cavity electrical contact 132 is positioned to conduct electrical current in circuit with electrical contact 118 through current path 103. In this embodiment, for simplification, contact 132 is illustrated on the rear surface of substrate 102 but it could be positioned in a variety of places.

In this embodiment, substrate 102 includes gallium arsenide (GaAs). However, it will be understood that the choice of substrate material and the material included in active region 108 generally depends on a desired wavelength of operation which in this embodiment is between approximately 0.8 μm to 1.0 μm. It will also be understood that the wavelength range from 0.8 μm to 1.0 μm is typically used in optical communication applications, such as fiber optical networks. However, other wavelength ranges may be suitable for a given application.

As is understood in the art, mirror regions 104 and 114 include a stack of alternate layers of materials wherein each adjacent layer has a different index of refraction. For example, mirror regions 104 and 114 in this embodiment include a Distributed Bragg Reflector (hereinafter referred to as "DBR") with alternate layers of semiconductor material, such as aluminum arsenide (AlAs) and gallium arsenide (GaAs). In other embodiments, at least one of mirror regions 104 or 114 may include alternate layers of an alloy of AlGaAs. It will be understood that mirror regions 104 and 114 may include other suitable reflective materials that are stacked alternately between a high and a low index of refraction. Further, in the preferred embodiment, each layer in mirror regions 104 and 114 may have thicknesses approximately equal to one quarter of the wavelength of operation to provide a desired reflective property.

Mirror region 114 includes a total number of layers in a range from two layers to ten layers (one to five pairs of layers) wherein mirror region 114 has a total thickness 115 in a range from approximately 1000 Å to 10,000 Å. It will be understood that thickness 115 of mirror region 114 may be chosen to obtain a desired implantation profile for implant region 112 and to provide a desired current distribution, as will be explained in more detail presently.

It will be understood that mirror region 120 includes a stack of alternate layers of materials where each adjacent layer in mirror region 120 has a different index of refraction. Further, mirror region 120 includes alternate layers of materials wherein each layer in the alternate layers has a thickness approximately equal to one quarter of the wavelength of operation. In this embodiment mirror region 120 is a dielectric distributed Bragg reflector, because of the convenience in fabrication, and in conjunction with mirror region 114 provides the required reflection for good lasing action. For example, mirror region 120 includes alternate layers of silicon oxide ($SiO_2$) and titanium oxide ($TiO_2$) or mirror region 120 may include alternate layers of magnesium fluoride (MgF) and zinc selenide (ZnSe).

In this embodiment, mirror region 120 is positioned on current spreading region 116 by using a dielectric lift-off process. However, it will be understood that mirror region 120 may be deposited using other deposition techniques well know to those skilled in the art, such as sputtering or the like.

In this embodiment, active region 108 includes a plurality of quantum structure layers with a band gap wavelength wherein each quantum structure layer emits light at the wavelength of operation. For example, active region 108 may include layers of aluminum gallium arsenide (AlGaAs), gallium arsenide (GaAS), or indium gallium arsenide (InGaAs). It will be understood that active region 108 may include quantum wells or other device structures with suitable light emission properties, such as quantum dots or similar device structures. The quantum structure layers, quantum wells, quantum dots, etc. are spaced within active region 108 in a well known manner to provide the desired light generation.

In this embodiment, cladding regions 106 and 110 include aluminum gallium arsenide (AlGaAs) with a higher aluminum (Al) composition than the aluminum composition of the layers included in active region 108. Further, it will be understood that while cladding regions 106 and 110 are illustrated, for simplicity, as including a single material layer, cladding regions 106 and 110 generally each include more than one layer. It will be understood that cladding regions 106 and 110 may include other suitable cladding materials with various doping configurations. Also, in this embodiment, current spreading region 116 includes heavily doped aluminum gallium arsenide (AlGaAs) with a higher aluminum (Al) composition than the aluminum composition of active region 108.

It will be understood that the various regions included in VCSEL 100 (i.e. mirror region 104, cladding region 106, active region 108, cladding region 110, mirror region 114, current spreading region 116, and mirror region 120) may be formed or deposited using various deposition techniques well known to those skilled in the art. Hence, it will be understood that the chosen deposition technique is not meant to limit the scope of the invention. For example, in this embodiment, VCSEL 100 is formed using metalorganic chemical vapor deposition (MOCVD). However, it will be understood that VCSEL 100 may be formed using chemical vapor deposition, sputtering, molecular beam epitaxy, or combinations thereof.

In this embodiment, mirror region 120 is positioned on current spreading region 116 using a lift off process to form a mesa 119. It will also be understood that in some embodiments, mirror region 120 may be positioned on current spreading region 116 and etched down to current spreading region 116 to form mesa 119. An intra-cavity electrical contact 118 is positioned on current spreading region 116 to provide an electrical connection to external electronic circuitry. Intra-cavity electrical contact 118 generally includes a metal but may include a highly doped semiconductor material or other suitable contact materials. Further, contact region 118 is illustrated as including a single layer for simplicity and illustrative purposes. However, it will be understood that contact region 118 may include multiple conductive layers included to enhance retention on and contact with layer 116.

It will be understood that the etching of mirror region 120 does not significantly interfere with the electric conduction through cladding regions 106 and 110 and active region 108. It is well known to those skilled in the art that the etching of a semiconductor mirror region used to conduct electricity to the active region significantly changes the current conduction pattern. Therefore, patterning mirror region 120, which does not conduct current to active region 108, for mode control is a better mechanism than patterning a semiconductor DBR.

It will be understood that mirror region 104 and cladding region 106 have one conductivity type (i.e. n-type or p-type) and cladding region 110, mirror region 114, and current spreading region 116 have an opposite conductivity type (i.e. p-type or n-type). Thus, when a voltage is applied across device 100 (e.g. between contact region 118 and the bottom or back of substrate 102, a current flows through active region 108 so that light is emitted by active region 108. For the greatest efficiency and best operation, current flowing through active region 108 is spread or distributed as uniformly as possible across current path 103.

In prior art devices including implants for controlling current, electrical contacts are invariably situated either at the upper end of the upper mirror stack or radially a distance from the lasing cavity, i.e. the central current path. Thus, in all of these devices the current flows radially inwardly from adjacent the edges into the central current path or lasing cavity. This current flow results in a phenomenon known as "current crowding" around the inner edge of the current controlling implant. Because electrical current always follows the shortest path and/or the path of least resistance, more current flows adjacent the implant edges and less or none flows in the center, resulting in inefficient operation of the device.

To overcome the non-uniform or non-distributed current flow prevalent in the prior art, device 100 includes current spreading region 116, which is highly doped to provide good current conduction from electrical contact 118. Mirror region 114 is also included to aid in uniformly distributing the current within current path 103. Because of the different indices of refraction of the pairs of layers in mirror region 114, one layer generally has a low bandgap and the other layer of the pair generally has a high bandgap. This difference produces a resistance to current flow that ensures the flow of current vertically through mirror region 114, or the shortest and least resistive path. Thus, current spreading region 116 tends to spread current into current path 103 and mirror region 114 prevents the flow of current around the edge of implant region 112. That is, current flows into the central area of current spreading region 116 before it crosses mirror region 114 vertically into current path 103. Thus, current crowding is substantially eliminated.

As explained above, current spreading region 116 is heavily doped to minimize current crowding created by the position of intra-cavity contact region 118. For the embodiment where current spreading region 116 is doped n-type, the electron mobility is significant enough to increase current spreading through cladding region 110. Further, in this instance current flows vertically through p-type doped cladding layer 106 and mirror stack 104 so that the poorer electron mobility of the p-type doped material does not cause unwanted leakage currents.

An additional advantage is realized by incorporating mirror region 114 in the light path prior to current spreading region 116. The heavy doping of current spreading region 116 has a tendency to produce free carrier loss, which will reduce the efficiency of the device. However, mirror region 114, prior to current spreading region 116 in the light path, reflects a substantial portion of the light before it reaches current spreading region 116. Thus, while current spreading region 116 is not positioned at a node and, therefore, causes some free carrier loss, the inclusion of mirror region 114 greatly reduces the free carrier loss. As will be understood by those skilled in the art, the number of pairs of layers in mirror region 114 can be adjusted to maximize or enhance the implantation of implant region 112 while maximizing current spreading and reducing free carrier loss.

Figure 4:
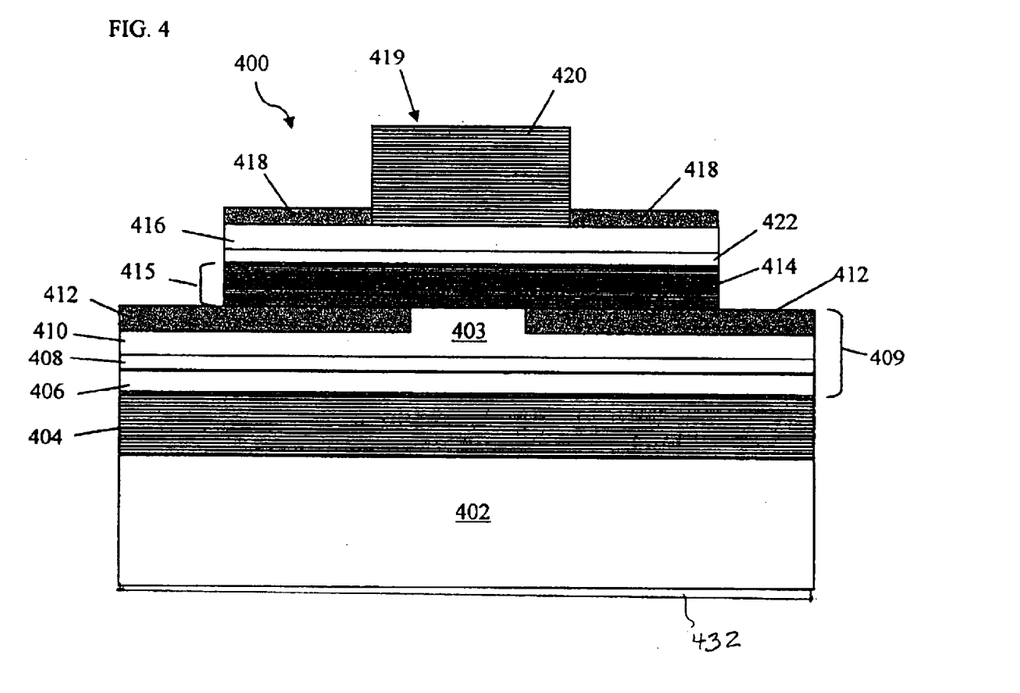
FIG. 4 is a simplified sectional view of another embodiment of a high speed implanted vertical cavity surface emitting laser with a hybrid mirror in accordance with the present invention.

Turning now to FIG. 4, a simplified sectional view of another embodiment is illustrated of a high speed implanted VCSEL 400 in accordance with the present invention. It will be understood that the elements included in VCSEL 400 which are similar to elements in VCSEL 100 of FIG. 3 are designated with similar numbers which begin with a '4' to indicate the different embodiment. Also, the above description of the various elements in FIGS. 1 through 3 applies equally to similar elements in FIG. 4.

In VCSEL 400, mirror region 414 and cladding region 410 are p-type doped so that current spreading layer 416 would normally be p-type doped. However, because of the low electron mobility of the p-type doped material, the current distribution would not be optimum and leakage current could be a problem. Thus, to avoid this potential problem it is preferred to utilize a tunneling barrier region 422 within current spreading region 416. While tunneling barrier region 422 could be positioned in a variety of different places, in this embodiment (for simplicity) it is positioned adjacent to mirror region 414.

Tunneling barrier region 422 includes a very thin p/n junction that allows current spreading layer 416 to be doped n-type. Tunneling barrier region 422 has a thickness generally in a range of 100 Å to 500 Å. As will readily be understood by those skilled in the art from this disclosure, tunneling- barrier region 422 adds only a small complexity to the fabrication process and it allows the fabrication of current spreading region 416 from much higher electron mobility n-type material. Because the material within and immediately adjacent current path 103 is p-type material some current leakage may occur. However, proper current spreading is more important than the small current leakage that may occur. Thus, in instances in which it is desired to form mirror region 412 and cladding region 410 of p-type material and mirror 404 and cladding region 406 of n-type material, current spreading region 416 can still be formed of the much higher electron mobility n-type material by using tunneling barrier region 422.

Figure 5:
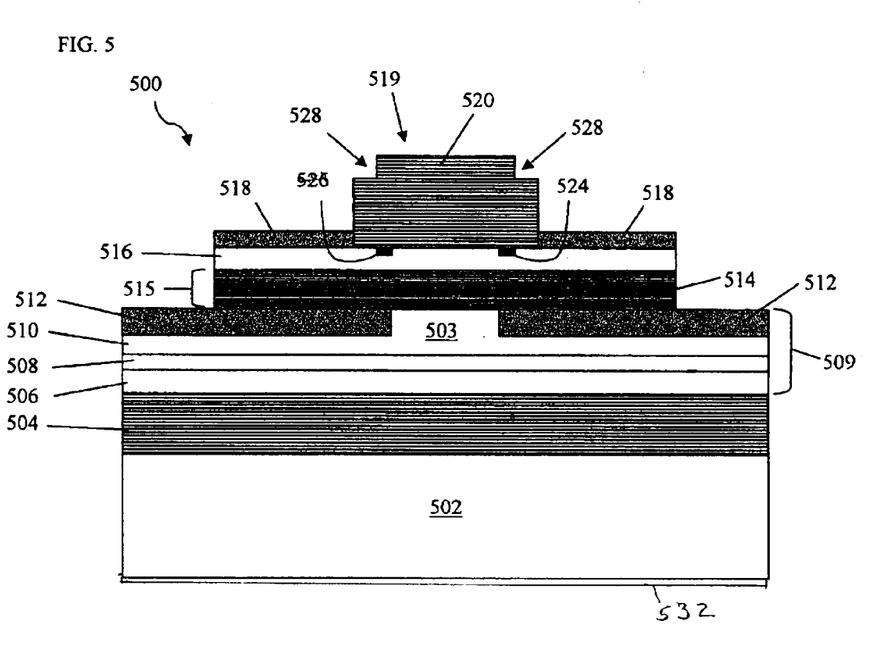
FIG. 5 is a simplified sectional view of another embodiment of a high speed vertical cavity surface emitting laser with a hybrid mirror in accordance with the present invention.

Turning now to FIG. 5, a simplified sectional view is illustrated of another embodiment of a high speed VCSEL 500 in accordance with the present invention. It will be understood that the elements included in VCSEL 500 which are similar to elements in VCSEL 100 of FIG. 3 are designated with similar numbers which begin with a '5' to indicate the different embodiment. Also, the above description of the various elements in FIGS. 1 through 3 applies equally to similar elements in FIG. 5.

In this embodiment, VCSEL 500 includes an index guide 524 formed in the upper surface of current spreading region 516 and adjacent to mirror region 520. Preferably, for simplicity, index guide 524 is formed by etching a shallow groove in current spreading region 516. Index guide 524 is approximately aligned with current path 503 and is positioned at approximately the outer limits of the first order mode to define a lasing cavity within VCSEL 500. It will be understood that index guide 524 is sufficiently deep to disrupt reflections of higher order modes so that higher order modes are substantially prevented from lasing or otherwise propagating.

Further, in this embodiment, a notch 528 is formed in the outer periphery of mirror region 520 adjacent the upper edge. Notch 528 is formed to limit the diameter of mirror region 520 to approximately the single or primary mode of operation. By removing a portion of mirror region 520 in the area that higher modes might propagate, reflection is reduced for the higher modes to a point that lasing cannot be supported. Thus, index guide region 524 and notch 528 are used to improve a single-mode output power of VCSEL 500 by increasing the lateral cross-section of the gain region while preserving single-mode lasing operation by means of mode selection measures (mode control) that preferentially enhance a modal gain of one mode through index guiding, or alternatively suppress the other competing higher order modes through higher reflection loss, e.g. by including notch 528.

By allowing the actively pumped area to increase while suppressing the competing modes that emerge through surface relief patterning, higher single-mode output power is achieved through a reduced current density, which leads to lower self-heating and reduced gain saturation. Further, the position of index guide region 524 is closer to active region 508 and is more effective in producing the index guiding, compared with prior art implanted VCSELs.

Figure 6:
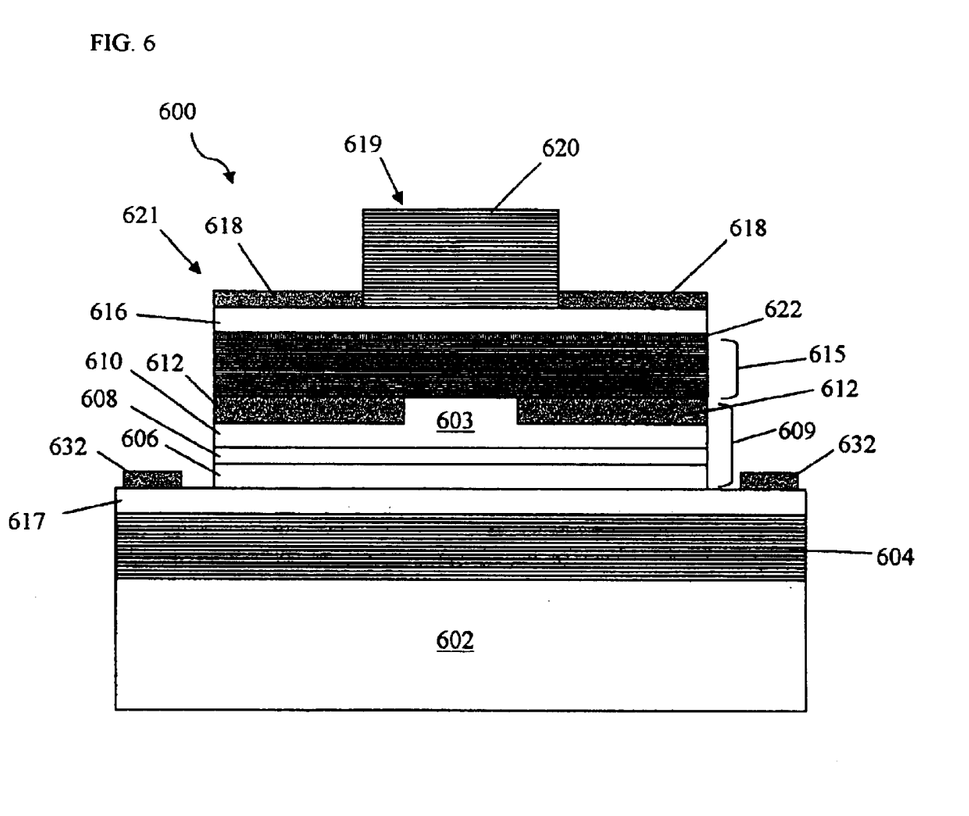
FIG. 6 is a simplified sectional view of another embodiment of a high speed vertical cavity surface emitting laser with a hybrid mirror in accordance with the present invention.

Turning now to FIG. 6, a simplified sectional view of another embodiment is illustrated of a high speed VCSEL in accordance with the present invention. It will be understood that the elements included in VCSEL 600 which are similar to elements in VCSEL 100 of FIG. 3 are designated with similar numbers which begin with a '6' to indicate the different embodiment. Also, the above description of the various elements in FIGS. 3 and 4 applies equally to similar elements in FIG. 6.

In this embodiment, VCSEL 600 includes a current spreading region 617 positioned between mirror region 604 and cladding region 606. VCSEL 600 is etched to current spreading region 617 to form a mesa. An intra-cavity electrical contact 623, generally formed of one or more layers of metal or the like, is positioned in electrical contact with current spreading region 617. It will be understood that current spreading region 617 is heavily doped and has the same conductivity type as cladding region 606 and mirror region 604.

In VCSEL 600, the current flows between intra-cavity electrical contacts 618 and 632 with a minimal amount of the current flowing through mirror region 604. Hence, mirror region 604 need not be compositionally graded near the interface between mirror region 604 and current spreading region 617.

One advantage of VCSEL 600 is that a common ground plane is not required so that substrate 602 may be formed of semi-insulating material and mirror region 604 can be undoped to reduce carrier loss. Also, without a common ground plane in VCSEL 600, high speed operation is easier to achieve because of the lower parasitic capacitances.

While the steps of the fabrication methods have been described, and will be claimed, in a specific order, it will be clear to those skilled in the art that various steps and procedures may be performed in different orders. It is intended, therefore, that the specific order described or claimed for the various fabrication steps does not in any way limit the invention and any variations in order that still come within the scope of the invention are intended to be covered in the claims.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms to enable those skilled in the art to understand and practice the same, the invention claimed is:

1. A vertical cavity surface emitting laser comprising:
   a first mirror region forming a first distributed Bragg reflector;
   a first cladding region positioned on the first mirror region;
   an active region positioned on the first cladding region;
   a second cladding region positioned on the active region and including a high electrical resistance implanted region positioned to define a current path;
   a second mirror region positioned on the second cladding region;
   a current spreading region positioned an the second mirror region;

a first electrical contact in electrical communication with the current spreading region and a second electrical contact positioned to conduct electrical current in circuit with the first electrical contact through the current path;

the current spreading region and the second mirror region cooperating to produce substantially uniform current distribution in the current path, the current spreading region having an index guide formed therein; and a third mirror region positioned on the current spreading region, the second and third mirror regions cooperating to produce a complete distributed Bragg reflector.

2. A vertical cavity surface emitting laser comprising:

a first mirror region forming a first distributed Bragg reflector;

a first cladding region positioned on the first mirror region;

an active region positioned on the first cladding region;

a second cladding region positioned on the active region and including a high electrical resistance implanted region positioned to define a current path;

a second mirror region positioned on the second cladding region;

a current spreading region positioned on the second mirror region;

a first electrical contact in electrical communication with the current spreading region and a second electrical contact positioned to conduct electrical current in circuit with the first electrical contact through the current path;

the current spreading region and the second mirror region cooperating to produce substantially uniform current distribution in the current path; and a third mirror region positioned on the current spreading region, the second and third mirror regions cooperating to provide a complete distributed Bragg reflector, the third mirror region having a notch formed therein to limit a diameter to approximately a primary mode of operation.

3. A vertical cavity surface emitting laser comprising:

a first mirror region forming a first distributed Bragg reflector;

a first cladding region positioned on the first mirror region;

an active region positioned on the first cladding region;

a second cladding region positioned on the active region and including a high electrical resistance implanted region positioned to define a current path;

a second mirror region positioned on the second cladding region;

a current spreading region positioned on the second mirror region;

a first electrical contact in electrical communication with the current spreading region and a second electrical contact positioned to conduct electrical current in circuit with the first electrical contact through the current path;

the current spreading region and the second mirror region cooperating to produce substantially uniform current distribution in the current path;

a third mirror region positioned on the current spreading region, the second and third mirror regions cooperating to provide a complete distributed Bragg reflector; and, a tunneling junction.

4. A vertical cavity surface emitting laser comprising:

a first mirror region forming a first distributed Bragg reflector;

a first cladding region positioned on the first mirror region;

an active region positioned on the first cladding region;

a second cladding region positioned on the active region and including a high electrical resistance ion implanted region positioned to define a current path;

a second mirror region positioned on the second cladding region including from one to five pairs of alternate mirror layers of a first semiconductor material with a first index of retraction and a second semiconductor material with a second index of refraction;

a current spreading region including a heavily doped semiconductor layer positioned on the second mirror region;

an index guide formed in the current spreading region, the index guide defining a lasing cavity;

a first electrical contact in electrical communication with the current spreading region and a second electrical contact positioned to conduct electrical current in circuit with the first electrical contact through the current path;

the current spreading region and the second mirror region cooperating to produce substantially uniform current distribution in the current path; and a third mirror region positioned on the current spreading region, the second and third mirror regions cooperating to provide a complete distributed Bragg reflector.

5. A vertical cavity surface emitting laser as claimed in claim 4 wherein the third mirror region includes a plurality of pairs of one of alternate semiconductor layers and alternate dielectric layers.

* * * * *

UNITED STATES PATENT AND TRADEMARK OFFICE
CERTIFICATE OF CORRECTION

PATENT NO.         : 6,906,353 B1
APPLICATION NO. : 10/715165
DATED                 : June 14, 2005
INVENTOR(S)       : Shieh et al

It is certified that error appears in the above-identified patent and that said Letters Patent is hereby corrected as shown below:

Col. 9, line 12, "produce" should read -- provide --

Col 10, line 29, "retraction" should read -- refraction --

Signed and Sealed this

Twenty-fifth Day of July, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,906,353 | Page 1 of 1 |
| APPLICATION NO. | : 10/715165 | |
| DATED | : June 14, 2005 | |
| INVENTOR(S) | : Shieh et al. | |

It is certified that error appears in the above-identified patent and that said Letters Patent is hereby corrected as shown below:

Col. 9, line 12, "produce" should read -- provide --

Col. 10, line 29, "retraction" should read -- refraction --

Signed and Sealed this

Twenty-ninth Day of August, 2006

JON W. DUDAS
*Director of the United States Patent and Trademark Office*